(12) United States Patent
Utumi (10) Patent No.: US 8,497,524 B2
(45) Date of Patent: Jul. 30, 2013

(54) ORGANIC EL DEVICE AND METHOD FOR MANUFACTURING THE SAME

(75) Inventor: Makoto Utumi, Nagano (JP)

(73) Assignee: Sharp Kabushiki Kaisha, Osaka (JP)

( * ) Notice: Subject to any disclaimer, the term of this patent is extended or adjusted under 35 U.S.C. 154(b) by 321 days.

(21) Appl. No.: 12/451,792

(22) PCT Filed: Jul. 24, 2008

(86) PCT No.: PCT/JP2008/063293
§ 371 (c)(1),
(2), (4) Date: Mar. 29, 2011

(87) PCT Pub. No.: WO2010/010622
PCT Pub. Date: Jan. 28, 2010

(65) Prior Publication Data
US 2011/0175137 A1    Jul. 21, 2011

(51) Int. Cl.
*H01L 33/00* (2010.01)

(52) U.S. Cl.
USPC .............................. 257/100; 257/79

(58) Field of Classification Search
USPC .................................. 257/79, 100
See application file for complete search history.

(56) References Cited

U.S. PATENT DOCUMENTS

| 2003/0129790 A1 | 7/2003 | Yamazaki et al. |
| 2004/0238104 A1 | 12/2004 | Suzuki et al. |
| 2005/0287686 A1 | 12/2005 | Won |

FOREIGN PATENT DOCUMENTS

| JP | 2004-047410 A | 2/2004 |
| JP | 2004-335127 A | 11/2004 |
| JP | 2005-285659 A | 10/2005 |
| JP | 2006-057121 A | 3/2006 |
| JP | 2006-261073 A | 9/2006 |
| JP | 2006-278228 A | 10/2006 |
| JP | 2006-278230 A | 10/2006 |
| JP | 2007-294416 A | 11/2007 |
| JP | 2008-504114 | 2/2008 |

*Primary Examiner* — Anthony Ho
(74) *Attorney, Agent, or Firm* — Rabin & Berdo, P.C.

(57) ABSTRACT

An organic EL device is provided and, in particular, a top-emission-type organic EL device, which can maintain excellent light emission efficiency over a prolonged period of time. The organic EL device includes a substrate; and an organic EL element that is formed on the substrate and that includes a lower electrode, an organic EL layer, an upper electrode, and a protective layer. The protective layer includes at least one inorganic film provided that at least one film thereof is a SiN:H film having a stretching-mode peak area ratio, as determined by infrared absorption spectrum measurements, of N—H bonds to Si—N bonds that is greater than 0.06 but does not exceed 0.1, and having a stretching-mode peak area ratio, as determined by infrared absorption spectrum measurements, of Si—H bonds to Si—N bonds that is greater than 0.12 but does not exceed 0.17.

8 Claims, 3 Drawing Sheets

ORGANIC EL DEVICE AND METHOD FOR MANUFACTURING THE SAME

CROSS-REFERENCE TO RELATED APPLICATION(S)

This non-provisional Application is the U.S. National Stage Application of Applicant's earlier filed PCT Application No. JP2008/063293, that was filed in Japan on Jul. 24, 2008, the entire contents of which are incorporated herein by reference.

BACKGROUND OF THE INVENTION

1. Field of the Invention

This invention relates to an organic EL device which is useful for display applications, and to a method for manufacturing such a device. More specifically, this invention relates to an organic EL device which prevents intrusion of moisture from the outside environment, and exhibits excellent light emission efficiency over a long period of time, and to a method for manufacturing such a device.

2. Description of the Related Art

In recent years energetic research has been performed on organic EL devices employing light-emissive organic EL elements. Organic EL devices are expected to achieve high emission luminance and emission efficiency. This is because high current densities are achieved at low voltages. In particular, commercialization of multicolor light-emitting organic EL devices capable of high-definition multicolor display, and in particular full-color display, is anticipated in the field of display technology.

Important problems for the commercialization of organic EL devices as color displays include, in addition to the realization of high definition, device long-term stability, including color reproducibility. However, multicolor light-emitting organic EL devices have the drawback of a prominent decline in light emission characteristics (current-luminance characteristics) due to driving over a certain period.

A representative cause of this decline in light emission characteristics is the growth of dark spots. A "dark spot" is a light emission defect point. A dark spot is thought to occur due to progressive oxidation or aggregation of the material in a component layer of an organic EL element during driving or storage, due to oxygen or water within the element. Dark spot growth proceeds during current conduction, of course, but also during storage. In particular, it is thought that dark spot growth is (1) accelerated by oxygen or water existing in the outside environment surrounding the element; (2) influenced by oxygen or water existing as an adsorbent in a component layer; and (3) influenced by water adsorbed on a component used in device manufacture, or by intrusion of water during manufacture. If this growth continues, the dark spot expands over the entire light-emitting face of the organic EL device.

Conventionally, as means to prevent the intrusion of water into a component layer of an organic EL element, a method of sealing the organic EL element using a metal container or glass plate, or a method of placing desiccant within a space within which the organic EL element is sealed, have been used. However, in order to exploit such features of organic EL devices as light weight and thin shape, technology for sealing with a thin film, without using a desiccant, has attracted attention.

As sealing thin films, silicon nitride, silicon oxide-nitride, and other films have been used. However, in order to suppress damage to the light emission layer during fabrication of films of these materials, it has been necessary to hold increases in temperature at the fabrication surface to at least the glass transition temperature of the light emission layer or lower. Hence film fabrication methods developed for organic EL devices using semiconductor processes cannot be applied, and there has been the problem that a sealing thin film having adequate moisture-proof properties cannot be formed.

On the other hand, in Japanese Patent Application Laid-open No. 2005-285659 (Patent Document 1), a film is proposed as a sealing film which can be applied to organic EL devices, formed by a plasma CVD method, and having as main components silicon and silicon nitride. In Patent Document 1, it is disclosed that by means of a number of silicon atoms bonded with silicon atoms per number of silicon atoms bonded with nitrogen atoms of 0.6 or greater and 2.0 or less, as measured by X-ray photoelectron spectroscopy, the film exhibits excellent sealing properties.

In order to improve the aperture ratio of organic EL devices employing active matrix driving, in recent years devices with so-called top-emission type structures, in which light is extracted from the opposite side of the substrate on which TFTs and other switching circuits are fabricated, have become the mainstream. In this structure, a transparent electrode and sealing film are formed on the organic EL layer, and light emitted from the organic EL layer passes through the sealing film and is emitted to the outside. However, the sealing film in Patent Document 1 comprises a substantial quantity of silicon-silicon bonds, and so has low transmittance of visible light, and cannot be used as the sealing film in a top-emission structure.

An object of this invention is to provide an organic EL device having stability over the long term, by using a protective film having high transmittance for visible light and excellent moisture resistance. Another object of this invention is to provide a method for manufacturing an organic EL device such as that described above.

SUMMARY OF THE INVENTION

An organic EL device of this invention comprises a substrate, and an organic EL element formed on the substrate, and is characterized in that the organic EL element comprises a lower electrode, an organic EL layer, an upper electrode, and a protective layer. The protective layer comprises at least one inorganic film, provided that at least one of the at least one inorganic film is a silicon nitride film comprising hydrogen, and has a stretching-mode peak area ratio of N—H bonds to Si—N bond, as determined by infrared absorption spectrum measurements, that is greater than 0.06 but does not exceed 0.1, and a stretching-mode peak area ratio of Si—H bonds to Si—N bonds that is greater than 0.12 but does not exceed 0.17. An organic EL device of this invention may have a structure in which the protective layer is in contact with the substrate and lower electrode. Or, an organic EL device of this invention may have a structure in which the protective layer is in contact with the upper electrode, and the lower electrode is in contact with the substrate. It is desirable that each of the at least one inorganic films constituting the protective layer have a stress with an absolute value smaller than 20 MPa.

The stretching-mode peak areas for N—H bonds, Si—H bonds, and Si—N bonds in this invention can be determined by a method comprising the steps of: (a) measuring an infrared absorption spectrum of the silicon nitride film, with wave number on an horizontal axis; (b) performing correction by subtracting a baseline from the infrared absorption spectrum obtained; (c) performing peak separation of absorption of the N—H bonds, the Si—H bonds, and the Si—N bonds, respectively, using a Gaussian function; and (d) determining an area of the respective separated peaks. Here, the stretching-mode peak area of the N—H bonds is determined from a peak existing at 3250 to 3400 cm$^{-1}$, the stretching-mode peak area of the Si—H bonds is determined from a peak existing at 2100 to 2200 cm$^{-1}$, and the stretching-mode peak area of the Si—N bonds is determined from a peak existing at 830 to 870 cm$^{-1}$.

An organic EL device manufacturing method of this invention is characterized in comprising the steps of: (1) preparing a substrate; and (2) forming on the substrate an organic EL element which comprises a lower electrode, an organic EL layer, an upper electrode, and a protective layer. The protective layer comprises at least one inorganic film provided that at least one of the at least one inorganic film is a silicon nitride film comprising hydrogen, that has a stretching-mode peak area ratio of N—H bonds to Si—N bonds, as determined by infrared absorption spectrum measurements, that is greater than 0.06 but does not exceed 0.1; and a stretching-mode peak area ratio of Si—H bonds to Si—N bonds, as determined by infrared absorption spectrum measurements, that is greater than 0.12 but does not exceed 0.17. The silicon nitride film comprising hydrogen is formed by a chemical phase growth method in which high-frequency power at from 25 MHz to 60 MHz is applied to a gas mixture containing monosilane, ammonia, and nitrogen; and the gas mixture has a flow ratio of ammonia to monosilane ranging from 0.5 to 1.

Among the circumstances of recent years, in which development of organic EL displays with higher light emission efficiencies has been sought, this invention can provide an organic EL device which can maintain an excellent light emission efficiency over long periods. Moreover, because a protective layer of this invention has high visible-light transmittance, a configuration of this invention is particularly useful in top-emission type organic EL devices.

DETAILED DESCRIPTION OF THE INVENTION

An organic EL device of this invention comprises a substrate, and an organic EL element formed on the substrate. The organic EL element comprises a lower electrode, an organic EL layer, an upper electrode, and a protective layer. The protective layer comprises at least one inorganic film provided that at least one of the at least one inorganic film is a silicon nitride film comprising hydrogen. The stretching-mode peak area ratio of N—H bonds to Si—N bonds in the silicon nitride film comprising hydrogen, as determined by infrared absorption spectrum measurements, is greater than 0.06 but does not exceed 0.1; and the stretching-mode peak area ratio of Si—H bonds to Si—N bonds is greater than 0.12 but does not exceed 0.17.

Figure 1:
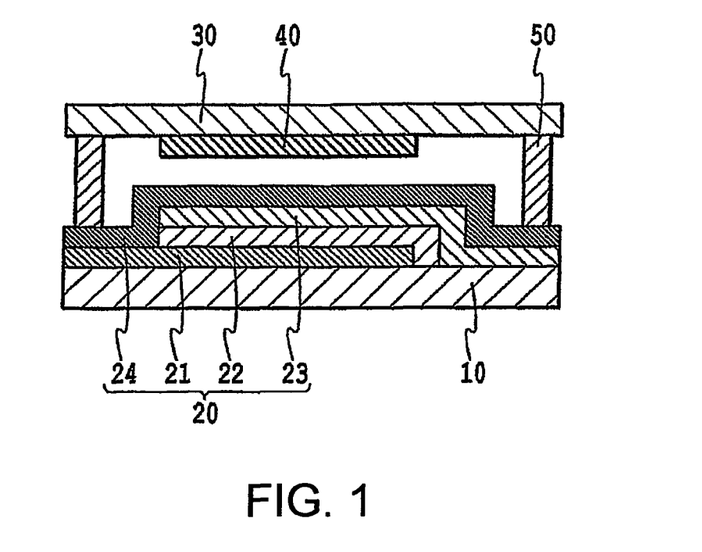
FIG. 1 is a cross-sectional view showing an example of an organic EL device of the invention.

FIG. 1 shows an example of an organic EL device of this invention. The organic EL device of FIG. 1 is a top-emission type organic EL device, comprising a substrate 10, and an organic EL element 20 formed by layering, in order on the substrate 10, a lower electrode 21, organic EL layer 22, upper electrode 23, and protective layer 24. While the configuration is optionally selected, a sealing substrate 30 on which is positioned a color conversion filter layer 40 is bonded by an adhesive layer 50 on the side of the substrate 10 on which the organic EL element 20 is formed.

Figure 2:
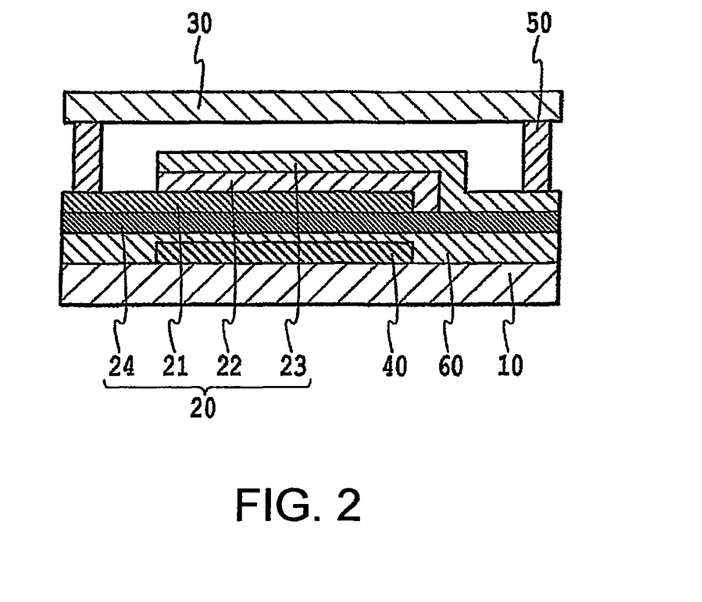
FIG. 2 is a cross-sectional view showing another example of an organic EL device of the invention.

FIG. 2 shows another example of an organic EL device of this invention. In the example of FIG. 2, the protective layer 24 is positioned between the substrate 10 and the lower electrode 21. The organic EL device of FIG. 2 is a bottom-emission type organic EL device. In FIG. 2, an example is shown in which a color conversion filter layer 40 and a flattening layer 60, which are optionally selected elements, are further comprised between the substrate 10 and the protective layer 24.

The substrate 10 in this invention can be formed using an arbitrary material which is able to withstand various conditions employed in the formation of other component layers (for example, solvents used, temperatures, and similar). It is desirable that the substrate 10 have excellent dimensional stability. Transparent materials used to form the substrate 10 include glass, polyolefins, polymethyl methacrylate and other acrylic resins, polyethylene terephthalate and other polyester resins, polycarbonate resins, polyimide resins, and other resins. When using the above-described resins, the substrate 10 may be rigid, or may be flexible. Or, in the case of the top-emission type organic EL device shown in FIG. 1 in particular, the substrate 10 may be formed using silicon, ceramics, or other opaque materials. The substrate can be formed using a flat material having insulating properties, and having rigidity enabling the form of the organic EL light-emitting element to be maintained.

The substrate 10 may further comprise, on the surface, a plurality of switching elements (TFTs and similar), wiring, and similar. This configuration is useful in fabricating active matrix driving-type organic EL devices having a plurality of independent light-emitting portions.

The lower electrode 21, positioned between the substrate 10 and the organic EL layer 22, and the upper electrode 23, positioned on the side of the organic EL layer 22 opposite from the substrate 10, have functions for injection of carriers into the organic EL layer 22 and for connection to an external driving circuit. The lower electrode 21 and upper electrode 23 may respectively be either the anode (hole-injecting electrode) or the cathode (electron-injecting electrode). However, one of the lower electrode 21 and upper electrode 23 is the anode, and the other is the cathode. Also, the lower electrode 21 and the upper electrode 23 may be a reflecting electrode or a transparent electrode with the condition that one of them is a transparent electrode. In the top-emission type structure shown in FIG. 1, it is desirable that the lower electrode 21 be a reflecting electrode, and the upper electrode 23 is a transparent electrode. In the bottom-emission type structure shown in FIG. 2, it is desirable that the upper electrode 23 be a reflecting electrode, and the lower electrode 21 is a transparent electrode.

A reflecting electrode used as the lower electrode 21 or upper electrode 23 can be formed using a metal with high reflectance (aluminum, silver, molybdenum, tungsten, nickel, chromium, or similar), or an alloy of these, or an amorphous alloy (NiP, NiB, CrP, CrB, or similar). Silver alloys are included as particularly preferable materials due to the fact that high reflectances of 80% or higher for visible light can be obtained. Silver alloys which can be used include alloys of silver and one or more metals selected from among group 10 nickel or platinum, group 1 rubidium, and group 14 lead, or, alloys of silver and at least one metal selected from among group 2 magnesium and calcium.

The transparent electrode used as the lower electrode 21 or upper electrode 23 can be formed using $SnO_2$, $In_2O_3$, an In—Sn oxide, an In—Zn oxide, ZnO, a Zn—Al oxide, or another conductive metal oxide. The transparent electrode serves as a path to extract light emitted from the organic EL layer 22 to the outside, and so it is desirable that the transparent electrode have a transmittance in the wavelength range from 400 to 800 nm of 50% or higher, and preferably of 85% or higher.

The lower electrode 21 and upper electrode 23 can be formed by an evaporation deposition method employing resistive heating or electron beam heating, or by a sputtering method. In the case of evaporation deposition, film deposition can be performed at a pressure of $1.0 \times 10^{-4}$ Pa or less, and at a film deposition rate of 0.1 to 10 nm/sec. On the other hand, when using a DC magnetron sputtering method or another sputtering method, Ar or another inert gas can be used as the sputtering gas, to deposit the film at a pressure of approximately 0.1 to 2.0 Pa. When forming the upper electrode 23 by a sputtering method, in order to prevent degradation of the organic EL layer 22 which is the surface of the substrate for film deposition, it is preferable that plasma formed in the vicinity of the target not be directly incident on the organic EL layer 22.

The organic EL layer 22 is positioned between the lower electrode 21 and the upper electrode 23, and is in contact with the respective electrodes. This layer is the essence of the light-emitting portion. Th organic EL layer 22 comprises at least a light-emitting layer, and as necessary comprises a hole transport layer, hole injection layer, electron transport layer, and/or electron injection layer. For example, the organic EL layer 22 can have the following layer configurations.

(1) Anode/light-emitting element/cathode.
(2) Anode/hole injection layer/light-emitting layer/cathode.
(3) Anode/light-emitting layer/electron injection layer/cathode.
(4) Anode/hole injection layer/light-emitting layer/electron injection layer/cathode.
(5) Anode/hole transport layer/light-emitting layer/electron injection layer/cathode.
(6) Anode/hole injection layer/hole transport layer/light-emitting layer/electron injection layer/cathode.
(7) Anode/hole injection layer/hole transport layer/light-emitting layer/electron transport layer/electron injection layer/cathode.

In each of the above configurations (1) to (7), the anode and the cathode may respectively be either the lower electrode 21 or the upper electrode 23.

The light-emitting layer can be formed using a well-known material. Materials to obtain emitted light ranging from blue to blue-green are, for example, benzothiazole compounds, benzoimidazole compounds, benzoxazole compounds, and other fluorescent brighteners; metal chelated oxonium compounds such as aluminum complexes, of which tris(8-hydroxyquinolinato) aluminum complex ($Alq_3$) is representative; styryl benzene compounds such as 4,4'-bis(diphenylvinyl)biphenyl (DPVBi); aromatic dimethylydene compounds; fused aromatic ring compounds; ring assembly compounds; porphyrin compounds; and similar.

Or, by adding a dopant to a host compound, a light-emitting layer which emits light in various wavelength regions can be formed. In this case, as the host compound, distyryl arylene compounds, N,N'-ditolyl-N,N'-diphenyl biphenyl amines (TPD), $Alq_3$, and similar can be used. On the other hand, as the dopant, perylene (blue-purple colors), cumarin 6 (blue colors), quinacridone compounds (blue-green to green colors), rubrene (yellow colors), 4-dicyanomethylene-2-(p-dimethyl aminostyryl)-6-methyl-4H-pyran (DCM, red colors), platinum octaethyl porphyrin complexes (PtOEP, red colors), and similar can be used.

A hole transport layer can be formed using materials having a triaryl amine partial structure, carbazole partial structure, or oxydiazole partial structure. Preferred materials for hole transport layers include TPD; 4,4'-bis[N-(1-naphthyl)-N-phenylamino]biphenyl (α-NPD), MTDAPB (o-, m-, p-), m-MTDATA, and similar. A hole injection layer can be formed using copper phthalocyanine (CuPc) complexes and other phthalocyanine (Pc) complexes, indanthrene compounds, and other materials.

An electron transport layer can be formed using an aluminum complex such as $Alq_3$, an oxadiazole derivative such as PBD or TPOB, a triazole derivative such as TAZ, a triazine derivative, a phenyl quinoxaline derivative, a thiophene derivative such as BMB-2T, or similar materials. An electron injection layer can be formed using an aluminum complex such as $Alq_3$, an aluminum quinolinol complex doped with an alkali metal or an alkali earth metal, or similar materials.

In addition to the above component layers, a buffer layer to further raise the carrier injection efficiency (not shown) can be optionally selected for use anywhere between the organic EL layer 22 and either the lower electrode 21 or the upper electrode 23 used as a cathode. A buffer layer can be formed using an alkali metal, an alkali earth metal, or an alloy of these, or a rare earth metal, or a fluoride of such metals, or other materials with electron-injection properties.

Further, it is preferable that a damage relaxation layer (not shown), comprising MgAg or similar, be formed on the surface of the organic EL layer 22 for the purpose of relaxation of damage during formation of the upper electrode 23.

It is important that each of the layers constituting the organic EL layer 22 has a film thickness sufficient to express the desired characteristics. In this invention, it is desirable that the light-emitting layer, hole transport layer, electron transport layer, and electron injection layer have film thicknesses of 2 to 50 nm, and that a hole injection layer have a film thickness of 2 to 200 nm. Further, it is preferable that an optionally selected buffer layer have a film thickness of 10 nm or less, from the standpoints of lowering the driving voltage and improving transparency.

Each of the component layers of the organic EL layer 22, a buffer layer, and a damage relaxation layer, can be fabricated using arbitrary means known to practitioners of the art, such as evaporation deposition (resistive-heating evaporation deposition or electron-beam evaporation deposition).

The protective layer 24 is a layer provided to prevent intrusion of water into electrodes and/or the organic EL layer 22, from the outside environment or from layers which may contain water. The protective layer 24 comprises one or a plurality of inorganic films. At least one of the inorganic films constituting the protective layer 24 is a silicon nitride film containing hydrogen (SiN:H). When the protective layer 24 comprises a plurality of inorganic films, in addition to a SiN:H film, a $SiO_x$ film, $SiO_xN_y$ film, $AlO_x$ film, $TiO_x$ film, $TaO_x$ film, $ZnO_x$ film, or similar may be used. When considering the ease of film formation, it is preferable that added films be Si system films.

The protective layer 24 may be provided in contact with the top of the upper electrode 23, as shown in FIG. 1, or may be provided between the substrate 10 and the lower electrode 21, as shown in FIG. 2. A protective layer 24 may be provided, as necessary both on the upper electrode 23 and between the substrate 10 and lower electrode 21.

It is desirable that the inorganic films constituting the protective layer 24 have little stress, in order to prevent film separation. In this invention, it is desirable that the stress in inorganic films have an absolute value of 20 MPa or less, whether the stress is contracting or expanding stress. The stress can be determined by, for example, forming an inorganic film on a Si wafer, and determining the change in warping of the Si wafer before and after inorganic film formation.

When positioned above the path of emission of light from the organic EL layer to the outside, it is desirable that the protective layer 24 have a high transmittance for visible light. Specifically, in the wavelength range from 400 to 800 nm, it is desirable that the transmittance be 50% or higher, and preferably 85% or higher. In addition, it is desired that a protective layer 24 have excellent moisture resistance properties. The inventor has found that by using SiN:H film, for which the stretching-mode peak area ratio of N—H bonds to Si—N bonds (hereafter called the "N—H/Si—N area ratio") is greater than 0.06 and 0.1 or lower, and for which the strength-mode peak area ratio of Si—H bonds to Si—N bonds (hereafter called the "Si—H/Si—N area ratio") is greater than 0.12 and 0.17 or lower, excellent moisture resistance properties and high visible-light transmittance of the protective layer 24 can be attained.

The SiN:H film constituting the protective layer 24 can be formed by a chemical vapor deposition (CVD) method. In particular, use of a plasma CVD method in which high-frequency power is applied is desirable. Further, in order to attain the above-described N—H/Si—N area ratio and Si—H/Si—N area ratio, it is desirable that the frequency of the high-frequency power be set to 25 MHz or higher and 60 MHz or lower. It is still more preferable that high-frequency power be used at a frequency of 27.12 MHz or higher. It is desirable that the power density of the high-frequency power be 0.1 to 2 W/cm$^2$. And, from the standpoint of avoiding damage to the substrate 10 or to layers already formed on the substrate 10, it is preferable that the SiN:H film be formed at a substrate temperature of 70° C. or lower.

In forming a SiN:H film by a plasma CVD method, a mixture of monosilane, ammonia, and an inert gas can be used as the raw material gas. In particular, it is desirable that a gas mixture of monosilane, ammonia, and nitrogen be used. Here, in order to realize a high visible-light transmittance for the SiN:H film; it is desirable that the flow ratio of ammonia to monosilane be 0.5 or higher. And, in order to realize excellent moisture resistance properties for the SiN:H film, it is desirable that the flow ratio of ammonia to monosilane be 1 or lower. In addition, by making the flow ratio of ammonia to monosilane 0.5 or higher and 1 or lower, the absolute value of the stress in the SiN:H film obtained can be made 20 MPa or lower. The above-described flow ratios are useful for satisfying the requirements for the N—H/Si—N area ratio and the Si—H/Si—N area ratio as well.

The method of determination of the N—H/Si—N area ratio and Si—H/Si—N are ratio in this invention is explained. First, the IR spectrum of the SiN:H film is measured. In this invention, the IR spectrum employs stretching mode absorption. Absorption in this mode is preferable because of the high intensities and the ease of peak separation. As the horizontal axis, a linear plot of the wave number (units: cm$^{-1}$) is used; the spectrum has no partial enlargement or similar. In order to eliminate background absorption, it is desirable that IR spectra be measured for the film substrate with the SiN:H film formed, and for the film substrate without an SiN:H film formed, and that the difference spectrum be taken.

Figure 3:
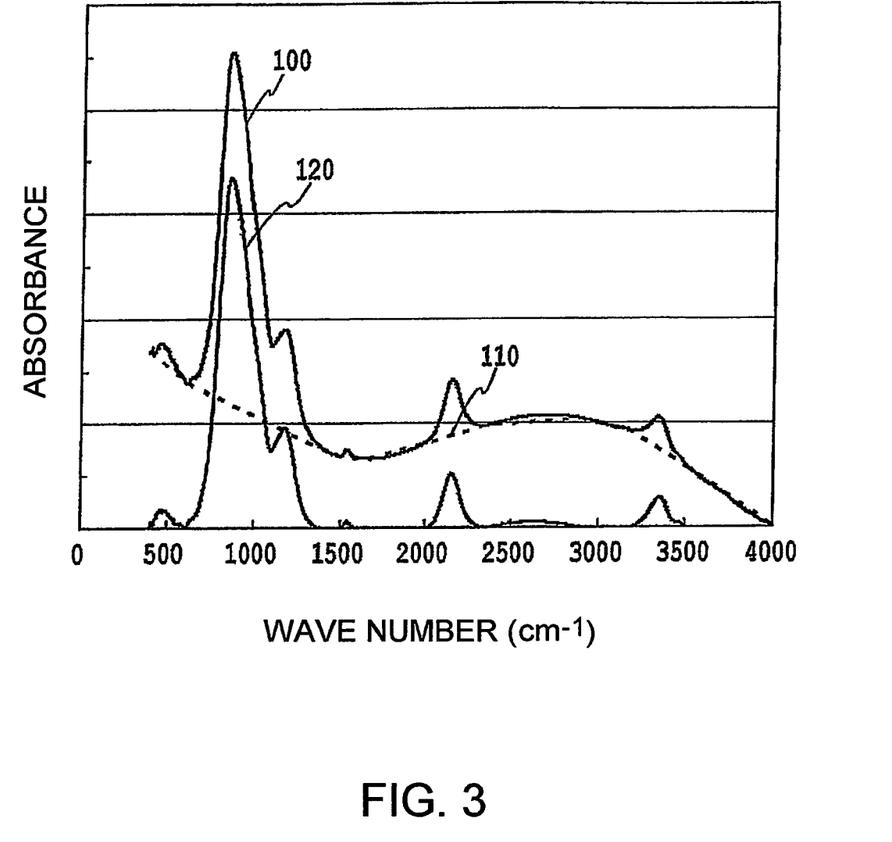
FIG. 3 is a diagram showing IR spectra used to determine the ratios of Si—N bonds, Si—H bonds, and N—H bonds in the silicon nitride film.

The IR spectrum obtained comprises absorbance fluctuations due to optical interference within the film. In order to eliminate these absorbance fluctuations, correction is performed using a baseline. FIG. 3 explains this correction process, and shows the as-measured IR spectrum 100, baseline 110, and IR spectrum after baseline correction 120. The baseline for a SiN:H film in this invention is obtained by using a straight line to connect the absorbances of the IR spectrum 100 at the wave numbers stipulated as follows: 400, 612, 1500, 1650, 2030, 2330, 2900, 3200, 3550, 4000 (cm$^{-1}$). At each of these wave numbers, the absorbance of the baseline 110 is subtracted from the absorbance of the IR spectrum 100, to obtain the baseline-corrected IR spectrum 120.

Next, peak separation is performed for the baseline-corrected IR spectrum 120. Peak separation is performed by representing each of the peaks using the Gaussian function $G_n$ expressed by equation (I).

$$G_n = A_n \exp(-B_n(x-C_n)^2) \quad (I)$$

Figure 4:
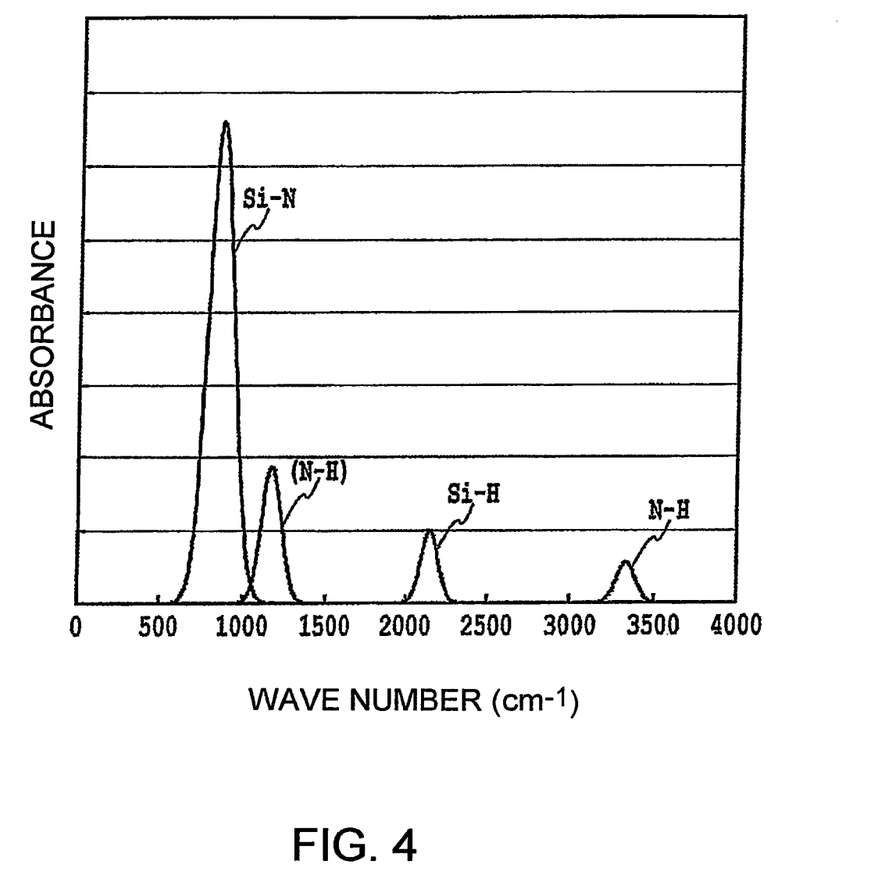
FIG. 4 shows an IR spectrum with peaks separated, used to determine the ratios of Si—N bonds, Si—H bonds, and N—H bonds in the silicon nitride film.

In the equation, $A_n$ is the maximum value of the absorbance for each peak, $C_n$ is the wave number (units: cm$^{-1}$) at which the absorbance is maximum for each peak, x is the wave number, and $B_n$ is a variable. Then, using the least squares method, $B_n$ is obtained for each peak. That is, each of the peaks is separated such that the sum of the squares of the differences between the sum of the Gaussian function $G_n$ for the peak and the absorbance of the baseline-corrected IR spectrum 120 is minimum. FIG. 4 shows the results of peak separation for the baseline-corrected IR spectrum 120 of FIG. 3.

In this invention, the peak having a maximum at 830 to 870 cm$^{-1}$ is taken to be the peak indicating the Si—N bond stretching mode, the peak having a maximum at 2100 to 2200 cm$^{-1}$ is taken to be the peak indicating the Si—H bond stretching mode, and the peak having a maximum at 3250 to 3400 cm$^{-1}$ is taken to be the peak indicating the N—H bond stretching mode. In FIG. 4, the peak having a maximum at approximately 1200 cm$^{-1}$ originates in N—H bonds, but is not used in calculation the N—H/Si—N area ratios of this invention.

Finally, the Gaussian function $G_n$ is integrated for each peak obtained by peak separation, the stretching-mode peak areas are determined for N—H bonds, Si—H bonds, and Si—N bonds, and these are used to determine the N—H/Si—N area ratio and the Si—H/Si—N area ratio.

The sealing substrate 30 can be formed using, for example, glass; SUS, Al, or another metal; or, a resin such as polyolefin, polymethyl methacrylate, or another acrylic resin, polyethylene terephthalate or another polyester resin, polycarbonate resin, or polyimide resin. When using a resin, the sealing substrate 30 may be rigid, or may be flexible. In the case of the top-emission type organic EL device shown in FIG. 1 in particular, the sealing substrate 30 is the path of emission of light from the organic EL layer 22 to the outside, and so it is desirable that the sealing substrate 30 be formed using glass, a resin, or another transparent material.

A color conversion filter layer 40 is a layer used to adjust the hue of light emitted from the organic EL layer 22. In this invention, a "color conversion filter layer" is a general term for a color filter layer, color conversion layer, or layered member comprising a color filter layer and color conversion layer. A color conversion filter layer 40 may be provided on the inside of the sealing substrate 30, as shown in FIG. 1, or may be provided between the substrate 10 and lower electrode 21, as shown in FIG. 2. In order to protect the pigments comprised thereby, it is difficult to completely dry a color conversion filter layer 40, and there are concerns that water may be contained therein. Hence when a color conversion filter layer 40 is provided on the inside of the sealing substrate, it is preferable that a protective layer 24 be provided on the upper face of the upper electrode 23, as shown in FIG. 1. Similarly, when a color conversion filter layer 40 is provided between the substrate 10 and the lower electrode 21, it is preferable that a protective layer 24 be provided between the color conversion filter layer 40 and the lower electrode 21, as shown in FIG. 2.

A color filter layer is a layer which transmits light in a specific wavelength range. A color filter layer has functions to improve the color purity of light from the organic EL layer 22 or from a color conversion layer. A color filter layer can be formed from commercially marketed color filter materials for flat panel displays (for example, Color Mosaic manufactured by FUJIFILM Electronic Materials Co., Ltd.). When forming a color filter layer, spin coating, roll coating, cast coating, dip coating, or other application methods can be used. And, a film formed by an application method can be patterned by photolithography or another method, to form a color filter layer having a desired pattern.

A color conversion layer is a layer which absorbs light in a specific wavelength range and performs wavelength distribution conversion, to emit light in a different wavelength region. A color conversion layer comprises at least a fluorescent pigment, and may comprise a matrix resin as necessary. A fluorescent pigment absorbs light from the organic EL layer 22, and emits light in a desired wavelength region (for example, the red region, the green region, or the blue region).

Fluorescent pigments which absorb light from the blue to the blue-green region and emit fluorescent light in the red region include, for example, rhodamine B, rhodamine 6G, rhodamine 3B, rhodamine 101, rhodamine 110, sulforhodamine, basic violet 11, basic red 2, and other rhodamine system pigments; cyanine system pigments; 1-ethyl-2-[4-(p-dimethyl aminophenyl)-1,3-buta-dienyl]-pyridinium-perchlorate (pyridine 1), and other pyridine system pigments; and oxazine system pigments. Or, various dyes having the above-described fluorescent properties (direct dyes, acidic dyes, basic dyes, disperse dyes, and similar) may be used.

Fluorescent dyes which absorb light in the region from blue to blue-green and emit fluorescent light in the green region include, for example, 3-(2'-benzothiazolyl)-7-diethyl amino cumarin (cumarin 6), 3-(2'-benzoimidazolyl)-7-diethyl amino cumarin (cumarin 7), 3-(2'-N-methyl benzoimidazolyl)-7-diethyl amino cumarin (cumarin 30), 2,3,5,6-1H, 4H-tetrahydro-8-trifluoro methyl quinolidine (9,9a,1-gh) cumarin (cumarin 153), and other cumarin system pigments; solvent yellow 11, solvent yellow 116, and other naphthalimide system pigments; and basic yellow 51 and other cumarin pigment system dyes. Or, various dyes having the above-described fluorescent properties (direct dyes, acidic dyes, basic dyes, disperse dyes, and similar) may be used.

As a matrix resin of a color conversion layer, an acrylic resin, various silicone polymers, and arbitrary materials which can be substituted therefor, can be used. For example, as a matrix resin, straight-type silicone polymers and modified resin-type silicone polymers can be used.

A color conversion layer can be formed using spin coating, roll coating, cast coating, dip coating, or other application methods, or using a vacuum evaporation method. When using a plurality of types of fluorescent pigments to form a color conversion layer, a plurality of types of fluorescent pigments in a prescribed ratio and a matrix resin are mixed to form a preliminary mixture, and this preliminary mixture can also be used in evaporation deposition. Or, a co-evaporation deposition method can be used to form the color conversion layer. A co-evaporation deposition method is performed by placing each of a plurality of types of fluorescent pigments in separate heating locations, and heating each separately. Mixtures of the fluorescent pigments and the matrix resin may be positioned at heating locations and used as evaporation sources as necessary. In particular, when the characteristics of the plurality of fluorescent pigments differ greatly (evaporation deposition rate and/or vapor pressure, and similar), the use of a co-evaporation deposition method is advantageous.

When using a color conversion filter layer 40 comprising a color conversion layer, a passivation layer (not shown) covering the entirety of the color conversion filter layer 40 may be formed, in order to prevent degradation of the color conversion layer characteristics. A passivation layer can be formed using an insulating oxide ($SiO_x$, $TiO_2$, $ZrO_2$, $AlO_x$, or similar), or an insulating nitride ($AlN_x$, $SiN_x$, or similar). The passivation layer can be formed by plasma CVD or another method. From the standpoint of preventing degradation of the color conversion layer, it is desirable that when forming the passivation layer, the temperature of the film deposition substrate, the uppermost layer of which is the color conversion filter layer 40, be 100° C. or lower.

As shown in FIG. 2, when forming a color conversion filter layer 40 between the substrate 10 and the lower electrode 21, it is desirable that a flattening layer 60 be formed so as to cover the color conversion filter layer 40. The flattening layer 60 flattens the surface used to form the organic EL element 20, and is advantageous with respect to preventing breaks, short circuits, and other faults in the organic EL element. The flattening layer 60 can be formed using a photohardening resin, a photohardening/thermosetting resin, a thermosetting resin, a thermoplastic resin, and similar. The flattening layer 60 can be formed using spin coating, roll coating, cast coating, dip coating, or other application methods.

An adhesive layer 50 is a layer used to bond the substrate 10 and sealing substrate 30. The adhesive layer 50 can be formed using, for example, a UV-hardening adhesive, a UV- and thermo-hardening adhesive, and similar. In order to reduce the influence of heat on the organic EL layer 22, it is desirable that a UV- and thermo-hardening adhesive be used. UV- and thermo-hardening adhesives which can be used include epoxy resin-type adhesives. Here, the above-described adhesives may comprise spacer particles to constrain the distance between the substrate 10 and the sealing substrate 30. Spacer particles which can be used include glass beads. The adhesive is applied to prescribed positions on the surface of either the substrate 10 or the sealing substrate 30, the substrate 10 and sealing substrate 30 are bonded together, and by hardening the adhesive, the adhesive layer 50 is formed. It is desirable that the adhesive layer 50 be provided at positions on the peripheral portions of the substrate 10 and sealing substrate 30, or in other positions at which the light-emitting portion of the organic EL element 20 does not exist.

FIG. 1 and FIG. 2 show examples of organic EL devices comprising a single light-emitting portion. However, an organic EL device of this invention may comprise a plurality of independently controlled light-emitting portions. For example, the lower electrode and upper electrode may both be electrode groups comprising a plurality of stripe-shape electrodes, and the direction of extension of the stripe-shape electrodes forming the lower electrodes may intersect the direction of extension of the stripe-shape electrodes forming the upper electrodes, in an organic EL device employing so-called passive matrix driving. Here, in a display application to display arbitrary pixels and/or characters, it is preferable that the direction of extension of the stripe-shape electrodes forming the lower electrodes, and the direction of extension of the stripe-shape electrodes forming the upper electrodes, be orthogonal. Or, a lower electrode may be divided into a plurality of partial electrodes, and each of the plurality of partial electrodes may be connected one-to-one with switching elements formed on the substrate, and the upper electrode may be an integral common electrode, to form an organic EL device employing so-called active matrix driving.

In the cases of both a passive matrix driving device and an active matrix driving device, it is desirable that an insulating film be provided between the plurality of partial electrodes forming the lower electrode. Insulating film can be formed using insulating oxides ($SiO_x$, $TiO_2$, $ZrO_2$, $AlO_x$, and similar), insulating nitrides ($AlN_x$, $SiN_x$, and similar), polymer materials, or similar.

Further, in a configuration having a plurality of independently controlled light-emitting portions, a plurality of types of color conversion filter layers can be used to form an organic EL device capable of multicolor display. For example, color conversion filter layers for red, green, and blue can be used, forming red, green, and blue subpixels, and arranging, in a matrix, pixels formed from one set of subpixels of the three colors, to form an organic EL device capable of full-color display.

EMBODIMENTS

Manufacturing Example 1

In this manufacturing example, by applying high-frequency power to a gas mixture of monosilane ($SiH_4$), ammonia ($NH_3$), and nitrogen, SiN:H film was formed, and the film characteristics were evaluated. In this manufacturing example, the monosilane flow rate was 100 sccm, the nitrogen flow rate was 2000 sccm, and the ammonia flow rate was varied in the range 20 to 110 sccm. At this time, the pressure of the gas mixture was 100 Pa. Using high-frequency power at a frequency of 27.12 MHz and power density of 0.5 W/cm$^2$, SiN:H film was formed on a film substrate at 50° C.

(1) Si, N, and H Content—

As the film substrate, a Si wafer of thickness 0.5 mm was used, and SiN:H film of thickness 1 μm was formed. An elastic recoil particle detection method and Rutherford backscattering method were combined in analyses of the SiN:H film obtained, and the contents of Si, N, and H in the SiN:H film were determined. The results appear in Table 1.

(2) N—H/Si—N Area Ratio and Si—H/Si—N Area Ratio—

As the film substrate a Si wafer of thickness 0.5 mm was used, and SiN:H film of thickness 1 μm was formed. The IR spectrum of the SiN:H film obtained was measured using a transmission-type Fourier transform infrared spectrometer. In order to remove background absorption due to the Si wafer, an Si wafer from the same lot was used as reference, and difference spectra for the SiN:H film/Si wafer layered member and for the Si wafer was measured. Next, the baseline was determined as explained above, baseline correction and peak separation were performed, the stretching-mode peak areas for N—H bonds, Si—H bonds, and Si—N bonds were determined, and the N—H/Si—N area ratio and Si—H/Si—N area ratio were determined. Results appear in Table 1.

(3) Moisture Resistance—

A SiN:H film of thickness 3 μm was formed so as to cover a calcium film of thickness 100 nm. The sample obtained was placed for 1000 hours in a thermostatic chamber at 95° C. and 50% RH, the area of the modified calcium film was measured, and the moisture resistance of the SiN:H film was evaluated.

Initially the calcium film was opaque. However, as the calcium reacts mainly with water in the environment, calcium hydroxide is formed, and the reacted portion of the film becomes transparent. In this manufacturing example, photographs of 500 μm×500 μm areas were taken, and "transparent" or "opaque" binary characterization of the photographs was performed, to evaluate the amount of water which penetrated the SiN:H film and reached the calcium film. The photographed areas were in the center portion of the sample, at which variation in film thickness was smallest. The percentage of the area of unmodified portions which did not become transparent was taken as an index of the moisture-resistant properties of the SiN:H film. Results appear in Table 1.

(4) Visible-Light Transmittance—

A spectral ellipsometer was used to determine the extinction coefficient at a wavelength of 450 nm for the SiN:H film of thickness 1 μm on Si wafer fabricated in (2) above, and the result was taken as an index of the visible-light transmittance. This is because, in transmittance measurements in the atmosphere, the influence of the difference in refractive index with air and of interference due to the film thickness is large. It is preferable that the film extinction coefficient at a wavelength of 450 nm be $4.0 \times 10^{-4}$ or lower. By this means, the transmittance for visible light is generally 95% or higher. Results appear in Table 1.

(5) Film Stress—

As the film substrate, a Si wafer of diameter 4 inches (approximately 10.2 cm) was used. Before film deposition, the warping of the Si wafer was measured. Then, SiN:H film of thickness 3 μm was formed, and the Si wafer warping after film deposition was measured. Film stress in the SiN:H film was calculated from the change in warping of the Si wafer before and after deposition. Results appear in Table 1.

TABLE 1

Effect of $NH_3/SiH_4$ flow rate ratio

| Sample number | $NH_3$ flow rate (sccm) | Composition (at %) | | | Si—H/Si—N area ratio | N—H/Si—N area ratio | Unmodified portion area ratio (%) | Extinction coefficient ($\times 10^{-4}$) | Film stress (MPa) |
|---|---|---|---|---|---|---|---|---|---|
| | | Si | N | H | | | | | |
| 1 | 20 | 62.6 | 15.0 | 22.4 | 0.05 | 0.03 | 80 | 75 | 5 |
| 2 | 30 | 51.1 | 21.4 | 27.5 | 0.07 | 0.05 | 85 | 22 | 6 |
| 3 | 40 | 41.6 | 31.1 | 27.3 | 0.11 | 0.06 | 90 | 6.3 | 6 |
| 4 | 50 | 35.8 | 36.4 | 27.8 | 0.13 | 0.07 | 90 | 3.6 | 6 |
| 5 | 60 | 34.4 | 36.9 | 28.7 | 0.14 | 0.08 | 92 | 2.1 | 7 |
| 6 | 70 | 33.0 | 37.4 | 29.6 | 0.15 | 0.08 | 96 | 2 | 7 |
| 7 | 80 | 32.4 | 37.7 | 30.0 | 0.163 | 0.091 | 95 | 2 | 11 |
| 8 | 90 | 31.5 | 37.6 | 31.0 | 0.16 | 0.09 | 93 | 2 | 15 |

TABLE 1-continued

Effect of $NH_3/SiH_4$ flow rate ratio

| Sample number | $NH_3$ flow rate (sccm) | Composition (at %) | | | Si—H/Si—N area ratio | N—H/Si—N area ratio | Unmodified portion area ratio (%) | Extinction coefficient ($\times 10^{-4}$) | Film stress (MPa) |
|---|---|---|---|---|---|---|---|---|---|
| | | Si | N | H | | | | | |
| 9 | 100 | 30.3 | 38.0 | 31.7 | 0.16 | 0.1 | 90 | 2 | 17 |
| 10 | 110 | 28.9 | 38.6 | 32.5 | 0.15 | 0.12 | 75 | 2 | 25 |

$SiH_4$ flow rate: 100 sccm, high-frequency power frequency: 27.12 MHz

From Table 1, it is seen that decreasing flow rate ratio of $NH_3$ relative to $SiH_4$ is generally accompanied by decreases in the N—H/Si—N area ratio and Si—H/Si—N area ratio. In particular, when the flow rate ratio of $SiH_4$ relative to $NH_3$ falls to 0.4 or less, the Si—H/Si—N area ratio drops to 0.11 or below, and moreover the N—H/Si—N area ratio falls to 0.06 or less. At the same time, it is seen that the film extinction coefficient increases, and visible-light absorption becomes prominent. In the region in which the flow rate ratio of $NH_3$ to $SiH_4$ is smaller than 0.4, it is inferred that an SiN:H film is obtained in a state of intermixed Si—N bonds, Si—H bonds, and Si—Si bonds. Such an SiN:H film with prominent visible-light absorption cannot easily be used as the protective layer of a top-emission type organic EL device. As the flow rate ratio of $NH_3$ to $SiH_4$ increases, the extinction coefficient declines, exhibiting a minimum at a flow rate ratio of 0.7 or higher.

On the other hand, with respect to moisture resistance, samples with $NH_3$ flow rates in the range 50 to 100 sccm, that is, with flow rate ratios of $NH_3$ to $SiH_4$ between 0.5 and 1.0, have an unmodified portion area ratio of 90 to 96%, so that the SiN:H film has satisfactory moisture resistance. This is attributed to the fact that in this range the nitrogen content in the SiN:H film is near the stoichiometric ratio. As the $NH_3$ flow rate was further increased to 110 sccm, the N—H/Si—N area ratio increased, the unmodified portion area ratio in moisture resistance tests decreased, and the moisture resistance of the SiN:H films declined. This indicates that the amount of nitrogen captured in the film increased, and when an excessive quantity of N—H bonds were formed in the SiN:H film and the N—H/Si—N area ratio exceeded 0.1, penetration of the SiN:H film by moisture increased rather than decreased.

It is seen that an increase in the flow rate ratio of $NH_3$ relative to $SiH_4$ is accompanied by an increase in stress in the SiN:H film. It was confirmed that by making the flow rate ratio of $NH_3$ relative to $SiH_4$ 1.0 or less, the absolute value of film stress can be made 20 MPa or less, and there is no danger of film separation. The inventor also confirmed that when the $NH_3$ flow rate is set to 150 sccm, an SiN:H film having stress of approximately 100 MPa was formed. When this film was used as a protective layer covering the substrate/lower electrode/organic EL layer/upper electrode in an organic EL device, unlit portions were observed from the beginning of lighting. This is thought to have occurred due to degradation of the organic EL layer by water in the atmosphere prior to lighting in portions in which film separation occurred.

Manufacturing Example 2

In this manufacturing example, the ammonia flow rate was fixed at 80 sccm, and the frequency of the high-frequency power applied was changed to 40.68 MHz or 13.56 MHz; otherwise, the same procedure used in Manufacturing Example 1 was used to form SiN:H film on film substrates. Evaluations similar to those of Manufacturing Example 1 were performed for the SiN:H films obtained. Results appear in Table 2.

TABLE 2

Effect of frequency of high-frequency power

| Sample number | Frequency (MHz) | Composition (at %) | | | Si—H/Si—N area ratio | N—H/Si—N area ratio | Unmodified portion area ratio (%) | Extinction coefficient ($\times 10^{-4}$) | Film stress (MPa) |
|---|---|---|---|---|---|---|---|---|---|
| | | Si | N | H | | | | | |
| 7 | 27.12 | 32.4 | 37.7 | 30.0 | 0.163 | 0.091 | 95 | 2 | 11 |
| 11 | 40.68 | 31.7 | 37.5 | 29.9 | 0.158 | 0.086 | 96 | 1.8 | 16 |
| 12 | 13.56 | 27.4 | 39.3 | 33.3 | 0.193 | 0.125 | 25 | 2.1 | 8 |

$SiH_4$ flow rate: 100 sccm, $NH_3$ flow rate: 80 sccm

From Table 2, it is clear that similarly to sample 7 fabricated using high-frequency power at 27.12 MHz, excellent characteristics are exhibited by sample 11, fabricated using high-frequency power at 40.68 MHz. On the other hand, in sample 12, fabricated using high-frequency power at 13.56 MHz, a phenomenon was observed in which the Si—H/Si—N area ratio and N—H/Si—N area ratio both increased as the nitrogen and hydrogen content in the film increased. This is thought to be due to the fact that $SiH_4$ and $NH_3$ were not sufficiently decomposed in the reaction chamber. Due to changes in the film properties, the unmodified portion area ratio of sample 12 fell dramatically. That is, it was found that the moisture resistance of the SiN:H film was greatly reduced.

From these results, it is seen that the film properties of SiN:H film are not determined simply by the nitrogen content of the film, but differ greatly depending on the Si—H/Si—N area ratio and the N—H/Si—N area ratio.

Embodiment 1

In this embodiment, a red light-emitting organic EL device with 2×2 pixels, each pixel of size 0.3 mm×0.3 mm, was fabricated.

As the substrate, fusion glass (Corning 1737 glass, 50×50× 1.1 mm) was prepared. A sputtering method was used to deposit Ag film to a thickness of 100 nm on the substrate. A photolithography method was used to pattern the Ag film obtained, to form two lower electrodes comprising stripe-shape electrodes of width 0.3 mm.

Next, the substrate with lower electrode formed was placed in a resistive-heating evaporation deposition device. By means of an evaporation deposition method using a mask, a buffer layer comprising Li, of film thickness 1.5 nm, was formed on the lower electrode 21. Then, evaporation deposition was used to form an organic EL layer, comprising four layers which were an electron transport layer/light-emitting layer/hole transport layer/hole injection layer. The electron transport layer was $Alq_3$ of thickness 20 nm, the light-emitting layer was DPVBi of thickness 30 nm, the hole transport layer was α-NPD of thickness 10 nm, and the hole injection layer was CuPc of thickness 100 nm. When depositing the organic EL layer, the pressure in the vacuum chamber of the device was $1\times10^{-4}$ Pa, and each layer was formed at a film deposition rate of 0.1 nm/s. Then, an evaporation deposition method was used to form a MgAg film of thickness 5 nm, to form a damage relaxation layer.

Next, the layered member with a damage relaxation layer formed was transferred to an opposed sputtering device without breaking the vacuum. A metal mask was used in sputtering to deposit IZO to a thickness of 100 nm, to form the transparent upper electrodes. The upper electrodes comprised two stripe-shape electrodes, of width 0.3 mm, extending in the direction orthogonal to the stripe-shape lower electrodes.

Next, the layered member with upper electrodes formed was transferred to a plasma CVD device, and the conditions of sample 6 in Manufacturing Example 1 were used to deposit a SiN:H film, to form a protective layer. That is, a gas mixture of monosilane, ammonia, and nitrogen was used as the raw material, high-frequency power was applied at a frequency of 27.12 MHz and power density of 0.5 $W/cm^2$, and the SiN:H film was formed. At this time, the flow rates of monosilane, ammonia and nitrogen were respectively 100 sccm, 70 sccm, and 2000 sccm. The pressure in the device during film deposition was 100 Pa, and the temperature of the stage holding the film substrate was 50° C. Through the above processes, an organic EL element, comprising lower electrodes/organic EL layer/upper electrodes, protective layer, was formed on a substrate. The organic EL element obtained was transferred to the interior of a bonding device, the internal environment of which was adjusted to an oxygen concentration of 5 ppm or lower and a water concentration of 5 ppm or lower.

Separately, fusion glass (Corning 1737 glass, 50×50×1.1 mm) was prepared as a sealing substrate. A red color filter material (Color Mosaic CR7001 (FUJIFILM Electronic Materials Co., Ltd.)) was deposited onto the transparent substrate, and patterning was performed to form a red color filter layer comprising four portions, of dimensions 0.5 mm×0.5 mm, at positions corresponding to the pixels of the organic EL element. The red color filter layer had a film thickness of 1.5 μm.

Next, the sealing substrate with red color filter layer formed was positioned in a resistive-heating evaporation deposition device. Using evaporation deposition, a red color conversion layer of thickness 300 nm, comprising cumarin 6 and DCM-2, was deposited on the red color filter layer. The cumarin 6 and DCM-2 were heated in separate crucibles, and the evaporation deposition rate of the cumarin 6 was set to 0.3 nm/s, while the evaporation deposition rate of the DCM-2 was set to 0.005 nm/s. The cumarin 6:DCM-2 molar ratio in the red color conversion layer was 49:1. Through the above processes, a sealing substrate having a red color conversion filter layer was formed. The sealing substrate thus obtained was transferred into the above-described bonding device.

Next, in the bonding device, an epoxy UV-hardening adhesive was dripped onto the outer periphery of the surface of the sealing substrate on which the red color conversion color filter layer was formed. With the red color conversion color filter layer and the organic EL element opposed, and with the position of the red color conversion color filter layer opposed to the pixels of the organic EL element, the substrate on which the organic EL element was formed and the sealing substrate on which the red color filter layer was formed were provisionally bonded. Then, the pressure within the bonding device was reduced to approximately 10 MPa, and the substrate and sealing substrate were bonded. After the completion of bonding, the pressure within the bonding device was raised to atmospheric pressure.

Next, a mask was used to irradiate with ultraviolet rays only the UV-hardening adhesive on the outer periphery of the sealing substrate, to provisionally harden the adhesive. The bonded member was heated to 80° C. for one hour in a heating furnace to harden the adhesive, forming an adhesive layer, to obtain the organic EL device. After the completion of heating, the organic EL device was naturally cooled inside the heating furnace over 30 minutes, and was then removed from the heating furnace.

Comparative Example 1

Except for the fact that the SiN:H film used as the protective layer was formed similarly to sample 3 in Manufacturing Example 1, the procedure of Embodiment 1 was repeated to form an organic EL device. That is, during formation of the SiN:H film, the ammonia flow rate was changed to 40 sccm to form the organic EL device.

The organic EL devices obtained in Embodiment 1 and Comparative Example 1 were placed in a 60° C., 90% RH environment, a current of current density 0.1 $A/cm^2$ was passed, and the devices were driven continuously over 1000 hours, and the voltage and luminance were measured. The luminance was divided by the current value to determine the light emission efficiency. With the light emission efficiency of the organic EL device of Embodiment 1 taken to be 1, the initial light emission efficiencies, and the light emission efficiencies after continuous driving for 1000 hours, of the organic EL devices of Embodiment 1 and Comparative Example 1 were determined. Results appear in Table 3.

TABLE 3

| Long-term stability of organic EL devices | | |
|---|---|---|
| | Light emission efficiency | |
| | Initial | After continuous driving for 1000 hours |
| Embodiment 1 | 1 | 0.8 |
| Comparative Example 1 | 0.9 | 0.3 |

As is seen from Table 3, the device of Comparative Example 1 initially exhibited a light emission efficiency slightly inferior to that of the device of Embodiment 1. This is attributed to the fact that the extinction coefficient of the SiN:H film used as the protective layer in the device of Comparative Example 1 was approximately three times the extinction coefficient of the film used in Embodiment 1. As a result, it is thought, a portion of the light generated in the organic EL layer was absorbed by the protective layer, so that the light emission efficiency was reduced.

It is also seen that the light emission efficiency after 1000 hours of continuous driving of the device of Comparative Example 1 is dramatically reduced compared with that of Embodiment 1. It is thought that in the device of Comparative Example 1, the decline in light emission efficiency progressed due to the intrusion of water passing through the SiN:H film used as the protective layer.

What is claimed is:

1. An organic EL device, comprising:
    a substrate; and
    an organic EL element formed on the substrate that is comprised of a lower electrode, an organic EL layer, an upper electrode, and a protective layer,
    wherein the protective layer comprises at least one inorganic film, provided that at least one of the at least one inorganic film is a silicon nitride film comprising hydrogen, and
    wherein the silicon nitride film has a stretching-mode peak area ratio of N—H bonds to Si—N bonds, as determined by infrared absorption spectrum measurements, that is greater than 0.06 but does not exceed 0.1, and has a stretching-mode peak area ratio of Si—H bonds to Si—N bonds, as determined by infrared adsorption spectrum measurements, that is greater than 0.12 but does not exceed 0.17.

2. The organic EL device according to claim 1, wherein the protective layer is positioned between the substrate and the lower electrode.

3. The organic EL device according to claim 2, wherein each of the at least one inorganic film has a stress value that has an absolute value smaller than 20 MPa.

4. The organic EL device according to claim 1, wherein the upper electrode has an upper face, and wherein the protective layer is positioned on the upper face of the upper electrode.

5. The organic EL device according to claim 4, wherein each of the at least one inorganic film has a stress value that has an absolute value smaller than 20 MPa.

6. The organic EL device according to claim 1, wherein each of the at least one inorganic film has a stress value that has an absolute value smaller than 20 MPa.

7. The organic EL device according to claim 1, wherein the stretching-mode peak areas for N—H bonds, Si—H bonds, and Si—N bonds are determined by a method comprising the steps of:
    (a) measuring an infrared absorption spectrum of the silicon nitride film with wave number on an horizontal axis,
    (b) performing correction by subtracting a baseline from the infrared absorption spectrum of step (a),
    (c) performing peak separation of absorption of the N—H bonds, the Si—H bonds, and the Si—N bonds, respectively using a Gaussian function to obtain respective separated peaks, and
    (d) determining area of the respective separated peaks, wherein a stretching-mode peak area of the N—H bonds is determined from a peak existing at 3250 to 3400 $cm^{-1}$, a stretching-mode peak area of the Si—H bonds is determined from a peak existing at 2100 to 2200 $cm^{-1}$, and a stretching-mode peak area of the Si—N bonds is determined from a peak existing at 830 to 870 $cm^{-1}$.

8. A method for manufacturing an organic EL device according to claim 1, comprising the steps of:
    (1) preparing a substrate; and
    (2) forming an organic EL element on the substrate, which is comprised of:
        a lower electrode;
        an organic EL layer;
        an upper electrode; and
        a protective layer comprised of at least one inorganic film provided that at least one of the at least one inorganic film is a silicon nitride film comprising hydrogen, for which a stretching-mode peak area ratio of N—H bonds to Si—N bonds, as determined by infrared absorption spectrum measurements, is greater than 0.06 but does not exceed 0.1, and for which a stretching-mode peak area ratio of Si—H bonds to Si—N bonds, as determined by infrared absorption spectrum measurements, is greater than 0.12 but does not exceed 0.17,
    wherein the silicon nitride film comprising hydrogen is formed by a chemical vapor deposition method including applying high-frequency power at from 25 MHz to 60 MHz to a gas mixture containing monosilane, ammonia and nitrogen, where the gas mixture has a flow rate ratio of ammonia to monosilane ranging from 0.5 to 1.

* * * * *